United States Patent
Katsuno et al.

(10) Patent No.: US 8,120,077 B2
(45) Date of Patent: Feb. 21, 2012

(54) SOLID-STATE IMAGING DEVICE COMPRISING DOPED CHANNEL STOP AT ISOLATION REGIONS TO SUPPRESS NOISE

(75) Inventors: Motonari Katsuno, Kyoto (JP); Ryouhei Miyagawa, Muko (JP); Masayuki Matsunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 840 days.

(21) Appl. No.: 11/298,535

(22) Filed: Dec. 12, 2005

(65) Prior Publication Data

US 2006/0131624 A1    Jun. 22, 2006

(30) Foreign Application Priority Data

Dec. 16, 2004    (JP) ................. 2004-365100

(51) Int. Cl.
*H01L 27/146* (2006.01)

(52) U.S. Cl. .............. 257/292; 257/431; 257/E27.13; 257/E27.133

(58) Field of Classification Search ............. 257/431, 257/436, 445, 446, 452, 510, 519, E31.02, 257/290, 291, 292, E27.122, E27.127, E27.13, 257/E27.131, E27.132, E27.133, E27.134, 257/E27.139, E31.011, E31.012, E31.014
See application file for complete search history.

(56) References Cited

U.S. PATENT DOCUMENTS

| | | | | |
|---|---|---|---|---|
| 4,463,383 A | * | 7/1984 | Soneda et al. | 348/300 |
| RE34,158 E | * | 1/1993 | Watanabe et al. | 257/42 |
| 6,211,509 B1 | * | 4/2001 | Inoue et al. | 250/208.1 |
| 6,507,365 B1 | * | 1/2003 | Nakamura et al. | 348/296 |
| 6,847,400 B2 | * | 1/2005 | Hosier et al. | 348/313 |
| 7,358,475 B2 | * | 4/2008 | Tanaka et al. | 250/208.1 |

FOREIGN PATENT DOCUMENTS

JP    5-291550    11/1993
JP    2000-353801    12/2000

OTHER PUBLICATIONS

U.S. Appl. No. 11/272,895 to Kasuga et al., filed Nov. 15, 2005.
English language abstract of JP 5-291550.
English language Abstract of JP 2000-353801 Dec. 19, 2000 and translation of paragraphs [0041]-[0047] and Figs. 1 and 2.

* cited by examiner

*Primary Examiner* — Lynne Gurley
*Assistant Examiner* — Andrew O. Arena
(74) *Attorney, Agent, or Firm* — Greenblum & Bernstein, P.L.C.

(57) ABSTRACT

Capacitance between a detection capacitor and a reset transistor is the largest among the capacitances between the detection capacitor and transistors placed around the detection capacitor. In order to reduce this capacitance, it is effective to reduce the channel width of the reset transistor. It is possible to reduce the effective channel width by distributing, in the vicinity of the channel of the reset transistor and the boundary line between an active region and an element isolation region, ions which enhance the generation of carriers of an opposite polarity to the channel.

11 Claims, 12 Drawing Sheets

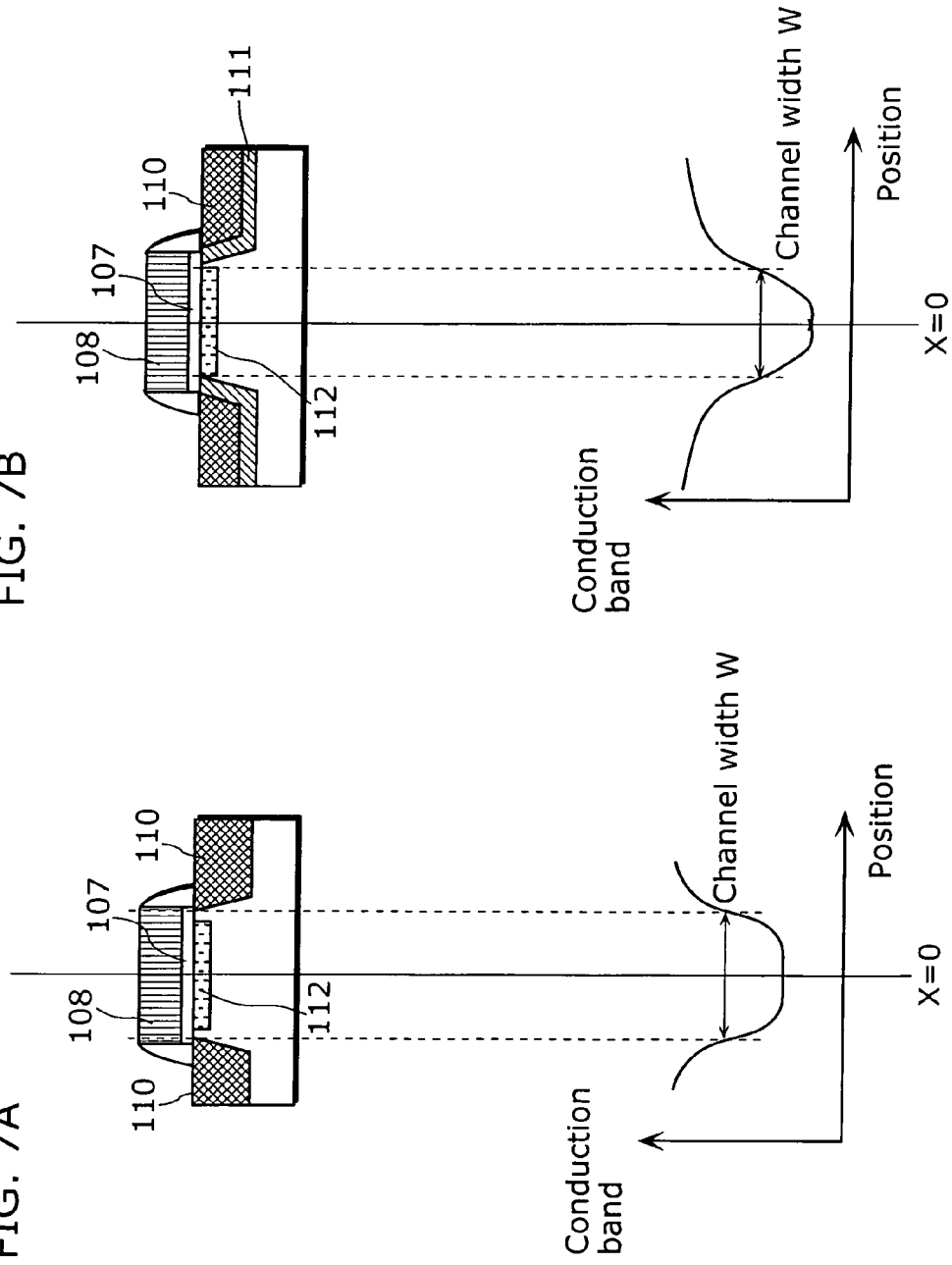

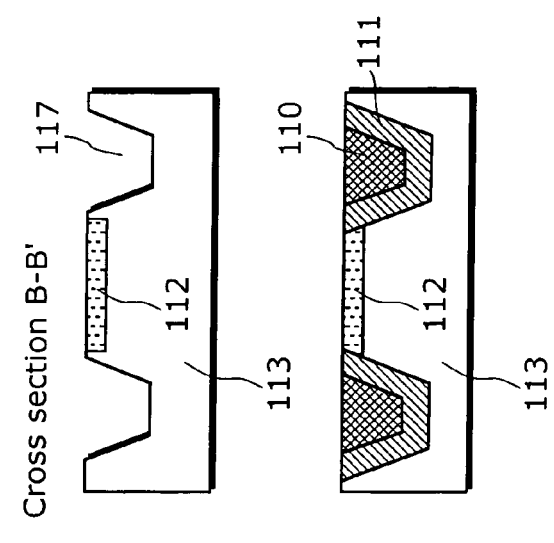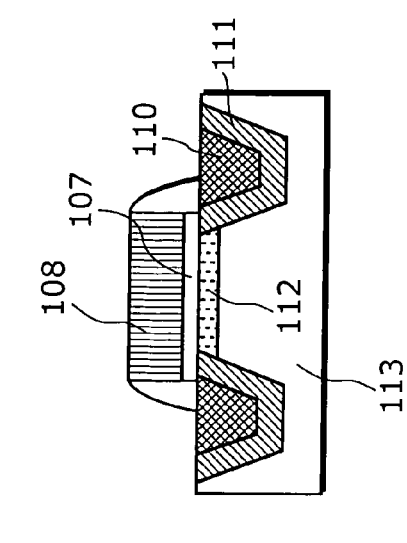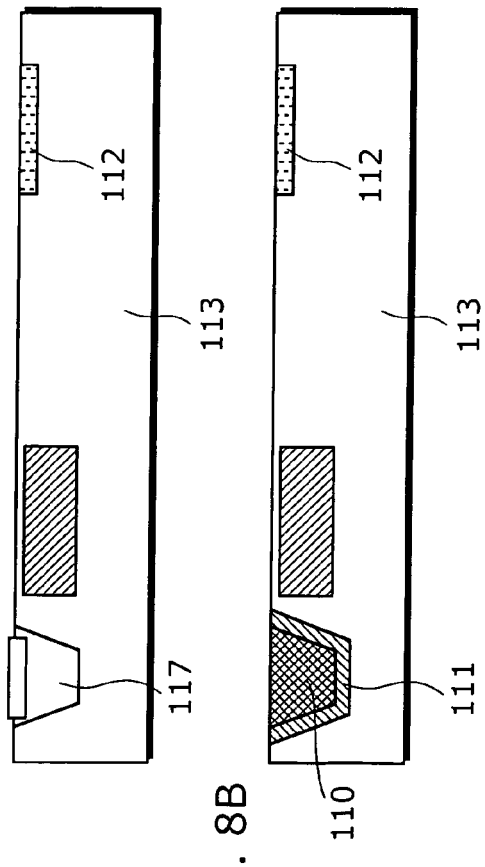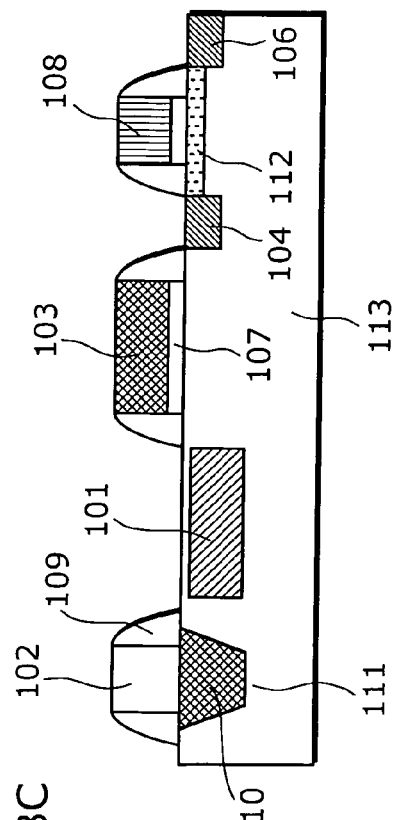
FIG. 8A
FIG. 8B
FIG. 8C

SOLID-STATE IMAGING DEVICE COMPRISING DOPED CHANNEL STOP AT ISOLATION REGIONS TO SUPPRESS NOISE

BACKGROUND OF THE INVENTION (1) Field of the Invention

The present invention relates to a solid-state imaging device.

(2) Description of the Related Art

A solid-state imaging device detects, as an electric signal, electric charge that is obtained through photoelectrical conversion and accumulated in a photodiode. In particular, it is made up of cells and signal detection circuits which are arranged in a two-dimensional array (vertically and horizontally) on a semiconductor substrate.

Conventionally, solid-state imaging devices such as a charge-coupled device (CCD) image sensor and a metal-oxide semiconductor (MOS) image sensor are well known. In a MOS-type image sensor, signal charge generated through conversion by a photoelectrical conversion region (photodiode) is amplified by a transistor. The main features of such MOS-type image sensor are not only its high sensitivity and low power consumption but also its capability of single power operation. To be more specific, a potential in a signal charge accumulation region is modulated by signal charge generated through photoelectric conversion, and an amplification coefficient of an amplifying transistor varies depending on the potential. Since a MOS-type image sensor includes an amplifying transistor in each pixel, reduction in the pixel size and increase in the number of pixels are expected.

A MOS-type image sensor has an advantage that it is easy to integrate various circuits, such as peripheral circuits (a resistor circuit and a timing circuit), an analog-to-digital (A/D) conversion circuit, an instruction circuit, a digital-to-analog (D/A) conversion circuit and a digital signal processor (DSP), on the same substrate. Such integration of functional circuits and MOS-type image sensor on the same chip achieves cost reduction.

FIG. 1 shows one example of a schematic circuit diagram of a MOS-type image sensor. An image capture area 10 is made up of a plurality of cells (11-1-1, 11-1-2, . . . 11-3-3) which are arranged in a tow-dimensional array.

Each cell 11 is made up of a photodiode 12 (12-1-1, 12-1-2, . . . 12-3-3) that is a photoelectrical conversion element, an electric charge transfer transistor 13 (13-1-1, 13-1-2, . . . 13-3-3), a reset transistor 14 (14-1-1, 14-1-2, . . . 14-3-3) for removing electric charge, and an amplifying transistor 15 (15-1-1, 15-1-2, . . . 15-3-3). In such cell, a photoelectrical conversion region is made up of the photodiode 12 and the electric charge transfer transistor 13, and a signal detection circuit region is made up of the reset transistor 14 and the amplifying transistor 15.

In the area around the image capture area 10, peripheral circuits such as a horizontal shift register 21 and a vertical shift register 22 are arranged. A horizontal pixel selection line 24 and a reset line 23 each select the cell positions in the horizontal direction using the horizontal shift register 21. The horizontal pixel selection line 24 is connected to the gate of each electric charge transfer transistor 13 in order to determine the line for reading out signal charge. A vertical voltage input transistor 28 is connected to a vertical signal line 26 in order to select the cell positions in the vertical direction.

Next, FIG. 2 and FIGS. 3A and 3B show the top view and the cross-sectional views of a MOS-type solid-state imaging device that is one example of a conventional solid-state imaging device.

FIG. 2 shows the top view of such MOS-type solid-state imaging device. The top surface is made up of the following three regions: an electric charge transfer transistor including a photodiode 101, a transfer gate 103 and a detection capacitor 104; a reset transistor including the detection capacitor 104, a reset gate electrode 108 and a drain region 106; and an amplifying transistor 105 including the drain region 106, a source region 115 and an amplifying gate 114.

FIGS. 3A and 3B show the cross-sectional views of the MOS-type solid-state imaging device. FIG. 3A shows the cross section A-A' in FIG. 2. On a semiconductor substrate 113, there are a phototransistor region, a reset transistor region and the electric charge amplifying transistor 105. The phototransistor region includes: the photodiode 101; the transfer gate 103 which is made up of a transfer gate electrode of a transfer transistor for transferring the electric charge generated from incident light and accumulated in the photodiode 101 and a gate insulating layer 107; and the detection capacitor 104 for accumulating the electric charge transferred from the photodiode 101 via the transfer gate 103. The reset transistor region includes, as a source region, the gate electrode 108, the drain region 106 and the above detection capacitor 104. The electric charge amplifying transistor 105 includes the drain region 106, the gate electrode 114 and the source region 115. The gate insulating layer is made of silicon oxides ($SiO_2$) or silicon nitride (SiN). FIG. 3B shows the cross section B-B' in FIG. 2. The channel width W below the gate is determined by the width of the area between the element isolation regions 110.

The operating principle of such MOS-type solid-state imaging device is as follows. The light detected by the photodiode 101 is converted into electric charge, and the electric charge is transferred to the detection capacitor 104 by turning on the transfer gate 103. Then, the electric charge accumulated in the detection capacitor 104 is transferred to the electric charge amplifying transistor 105 for performing signal amplification processing. Here, the reset gate electrode 108 is formed in order to completely remove the electric charge accumulated in the detection capacitor 104 therefrom, before the electric charge accumulated in the photodiode 101 is transferred to the detection capacitor 104 by turning on the transfer gate 103. By turning on the reset gate electrode 108 before transferring the electric charge to the detection capacitor 104, it becomes possible to completely transfer the charge to the drain region 106. In addition, the drain region 106 needs to be applied a plus voltage so that it has the higher voltage than the detection capacitor 104. This makes it possible to completely remove the carriers in the detection capacitor 104.

A conventional art has suggested a solid-state imaging device for reducing the capacitance of a detection capacitor (Japanese Laid-Open Patent Application No. H05-291550 Publication).

The signal accumulated in the detection capacitor 104 is normally read out as a voltage Vfd, and expressed by $$Vfd = Qfd/Cfd$$

where Qfd is the electric charge transferred from the photodiode 101 and accumulated in the detection capacitor 104, and Cfd is the capacitance of the detection capacitor 104. In order to obtain a more detailed signal as an image in a MOS-type solid-state imaging device in which pixels are arranged in an array, the cell size of a pixel needs to be reduced. As the cell size becomes smaller, the area of a photodiode becomes smaller and thus the amount of electric charge Qfd to be accumulated is reduced. Therefore, in the case where Qfd is a fixed value, Cfd needs to be reduced in order to increase Vfd.

In the conventional art, since Cfd is almost equal to Csub, Cfd can be reduced by reducing the area Sfd of the detection capacitor 104. Cfd is expressed as follows (see FIG. 4):

$$Csub = \epsilon \cdot Sfd/dfd$$

$$Cfd = Csub + Co + Cr + Cs + Cd$$

where Csub is the capacitance between the detection capacitor 104 and the substrate 113, dfd is the distance between the detection capacitor 104 and the substrate 113, Cr is the capacitance between the detection capacitor 104 and the reset gate electrode 108, Co is the capacitance between the detection capacitor 104 and the transfer gate 103, Cs is the capacitance between the detection capacitor 104 and the amplifying transistor 105, and Cd is the capacitance between the source 115 and the drain 106.

However, with the increased miniaturization of the detection capacitor 104, it has become difficult to ignore not only Csub but also other capacitance elements relatively and thus to reduce Cfd. In order to reduce the capacitance Cfd, it is effective, for example, to reduce the capacitance Cr generated between the detection capacitor 104 and the adjacent transistor, namely, the reset transistor. Such reduction of capacitance makes it possible to improve the charge-to-voltage conversion efficiency in the detection capacitor 104.

In order to reduce the capacitance between the detection capacitor 104 and the reset transistor, the channel width W below the reset gate electrode 108 has to be decreased. It is simply expressed by $$Cr = \epsilon \cdot Lr \cdot W/(Lr/2) = 2 \cdot \epsilon \cdot W$$

where W is the channel width below the reset gate electrode 108, $\epsilon$ is the permittivity, and Lr is the gate length of the reset gate electrode 108. The channel width of a transistor is normally determined by the width of an active region. Since the width of an active region (channel width) is almost determined by the resolution of a stepper used for a lithography process in semiconductor manufacturing processes, it is difficult to decrease the width to less than 0.2 µm to 0.3 µm.

SUMMARY OF THE INVENTION

It is an object of the present invention to provide a semiconductor solid-state imaging device that is capable of reducing a capacitance Cfd of a detection capacitor and to increase an output voltage in order to solve the above-mentioned conventional problems.

In order to achieve the above object, a solid-state imaging device according to the present invention includes: a photodiode which performs photoelectric conversion of incident light into signal charge; a transfer transistor which transfers the signal charge accumulated in the photodiode; a detection capacitor which accumulates the signal charge transferred by the transfer transistor; and a reset transistor which discharges, into a drain, the signal charge accumulated in the detection capacitor, wherein the photodiode, the transfer transistor, the detection capacitor and the reset transistor are formed on a semiconductor substrate, and ions are distributed at least on a sidewall of a channel below a gate electrode of the reset transistor, the ions enhancing generation of carriers of an opposite polarity to the channel. Here, the reset transistor has a gate width which is shorter than a gate length.

Here, it is preferable that the ions enhancing the generation of the carriers of the opposite polarity to the channel are distributed seamlessly from below the gate electrode of the reset transistor over the detection capacitor or the drain.

It is preferable that the effective gate width of the reset transistor is from 0.01 µm to 0.4 µm inclusive. In addition, it is preferable that the effective gate length of the reset transistor is from 0.1 µm to 1.0 µm inclusive.

Furthermore, in the solid-state imaging device of the present invention, ions are distributed in a boundary between an active region which forms the photodiode and an element isolation region which separates the active region for isolating each element, the ions enhancing generation of carriers of an opposite polarity to majority carriers of the photodiode.

As described above, it is possible to reduce an effective channel width accurately without the constraint of a resolution limit of a stepper used for a lithography process, by distributing, in the vicinity of the boundary between an active region and an element isolation region, ions which enhance the generation of carriers of a polarity opposite to the channel. Using this method, it is possible to reduce the channel width up to about 0.01 µm to 0.1 µm.

Therefore, the above-mentioned method of the present invention has the following effects. Firstly, it is possible to reduce the effective channel width of a reset transistor with the less manufacturing process steps than the conventional method, and therefore to realize a solid-state imaging device with high sensitivity and high image quality by reducing the capacitance of the detection capacitor and thus increasing the output voltage. Secondly, such solid-state imaging device can be manufactured by very simple process steps, and therefore the present invention is suitable for mass production.

As further information about technical background to this application, the disclosure of Japanese Patent Application No. 2004-365100 filed on Dec. 16, 2004, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIGS. 7A and 7B are explanatory diagrams of decrease in channel width of a transistor;

FIGS. 8A, 8B and 8C are diagrams showing a method for manufacturing a solid-state imaging device in a second embodiment of the present invention;

DESCRIPTION OF THE PREFERRED EMBODIMENT

Hereafter, the embodiments of the present invention are described with reference to the drawings.

First Embodiment

Figure 1:
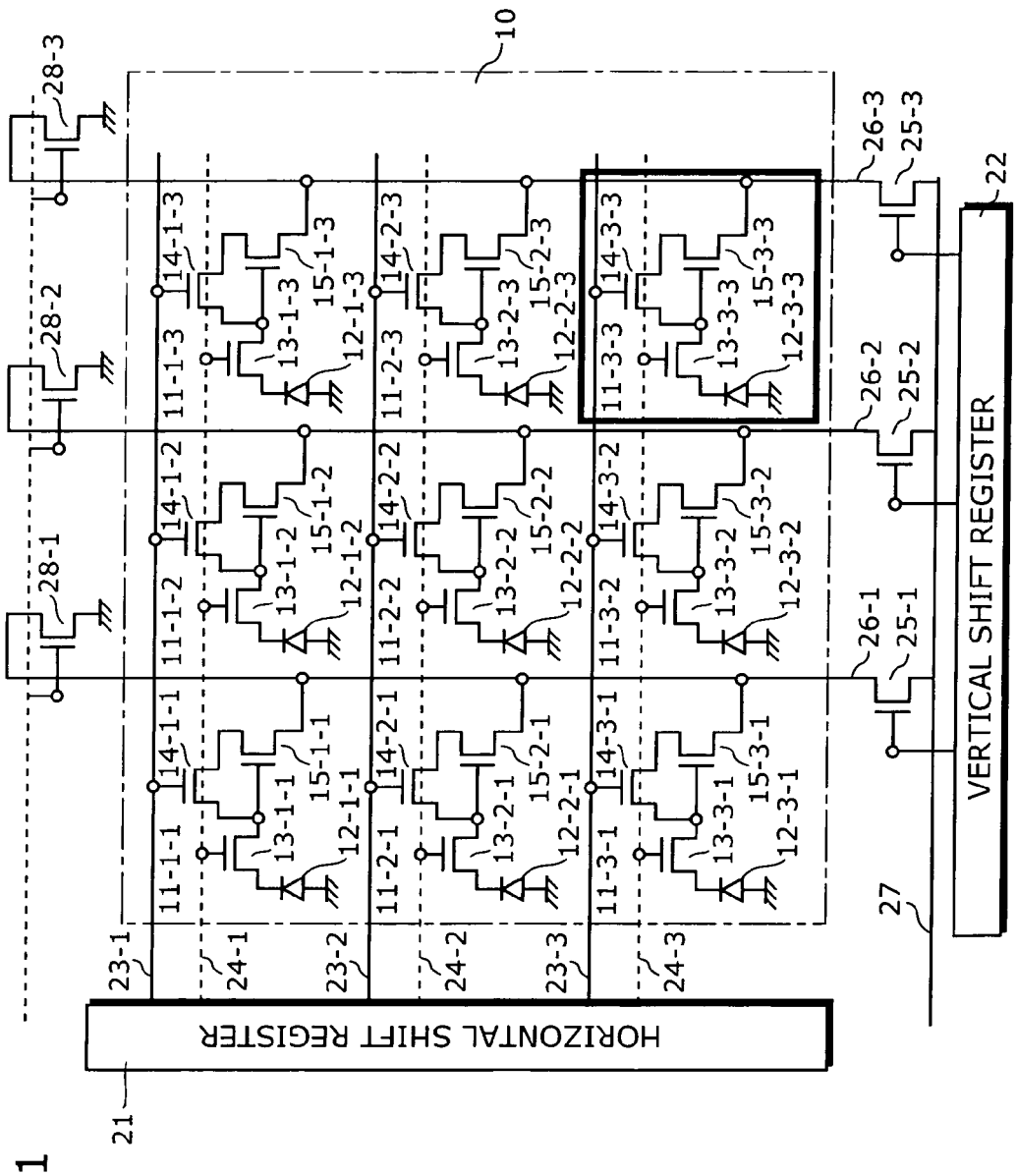
FIG. 1 is a structure diagram of a conventional solid-state imaging device.
Figure 2:
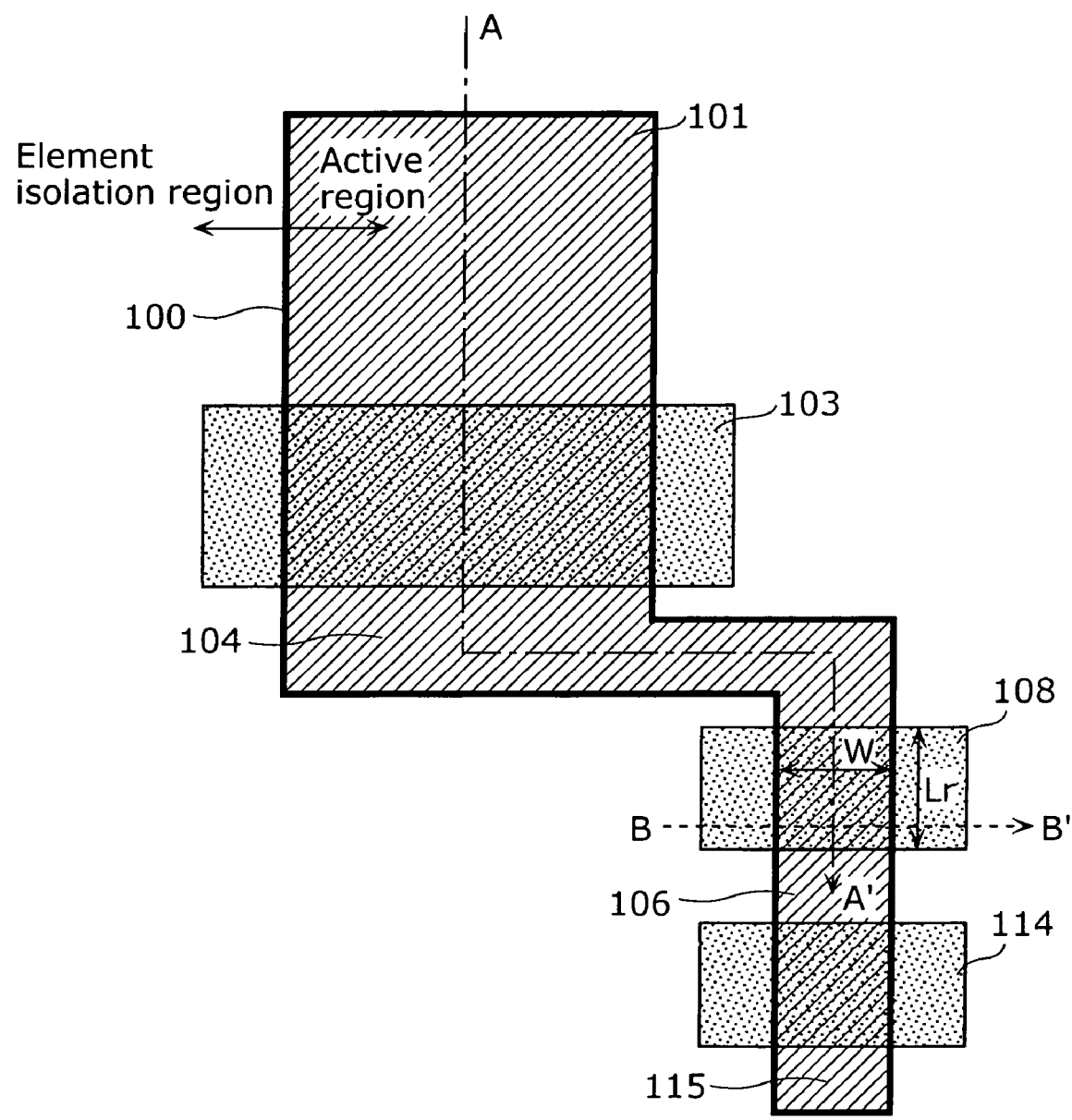
FIG. 2 is a structure diagram (top view) of the conventional solid-state imaging device.
Figure 3A:
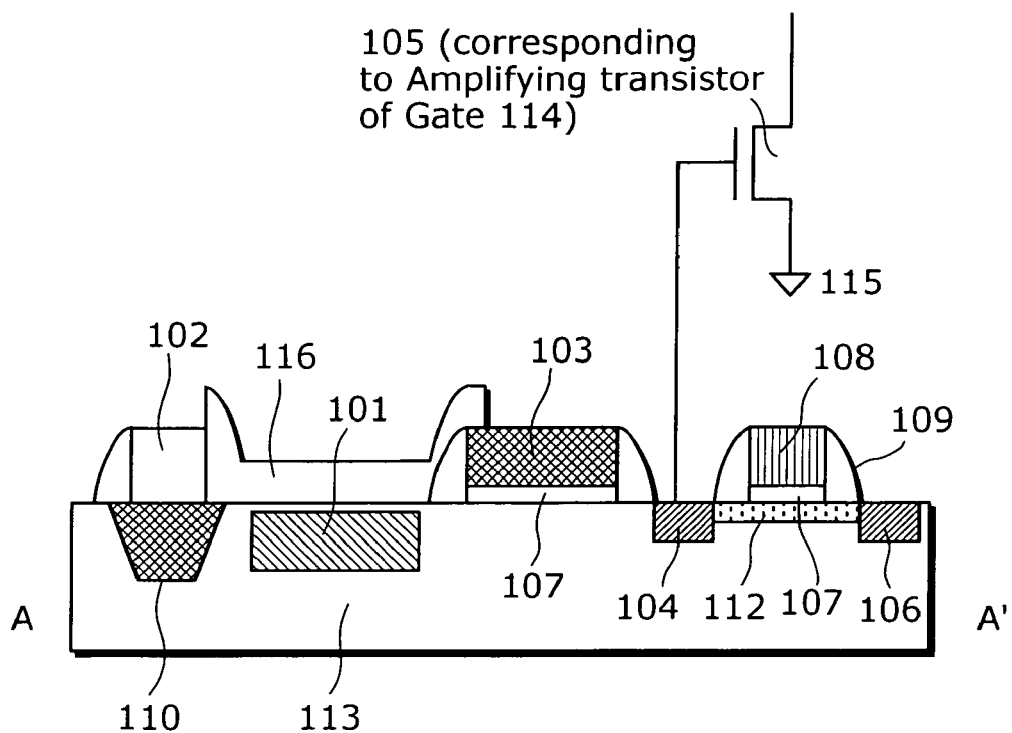
FIGS. 3A and 3B are structure diagrams (cross-sectional views) of the conventional solid-state imaging device.
Figure 3B:
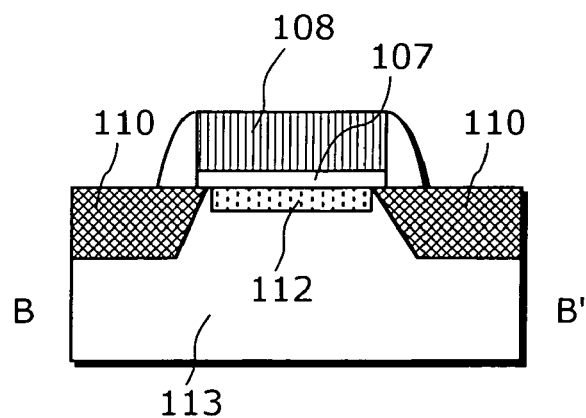
Figure 4:
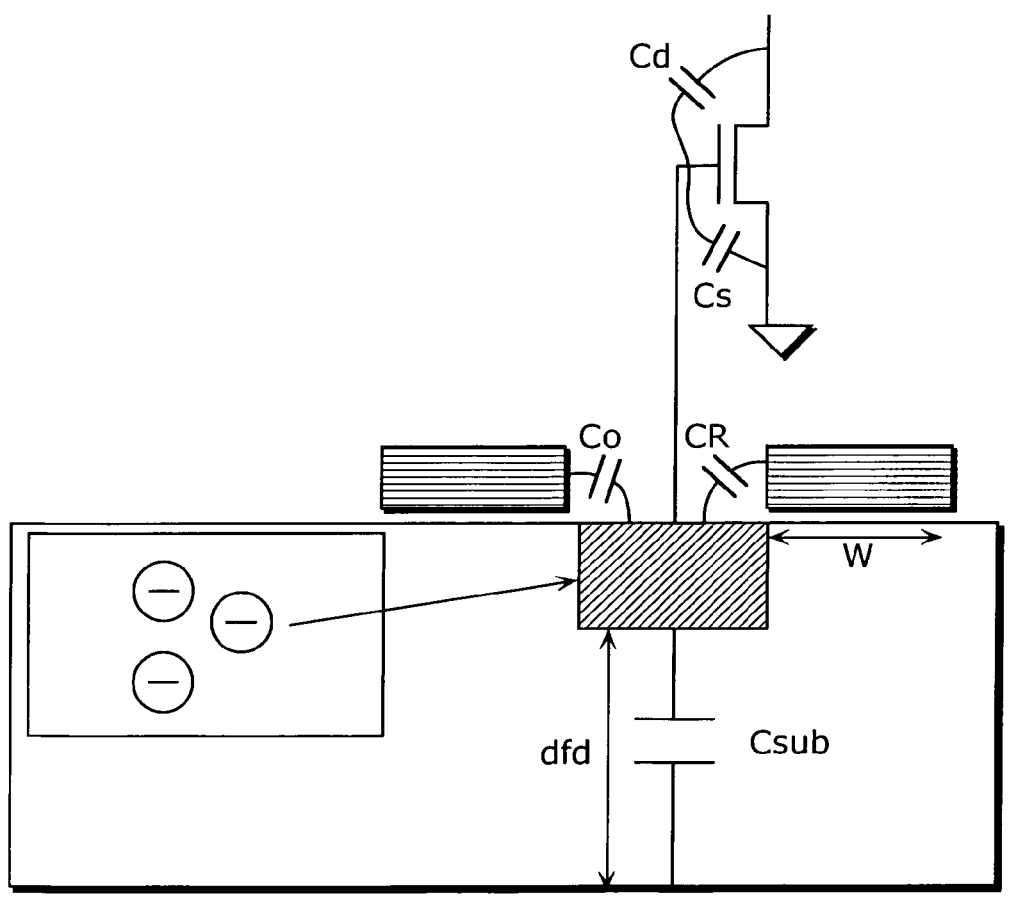
FIG. 4 is an explanatory diagram of a capacitance of a detection capacitor in a solid-state imaging device.
Figure 5:
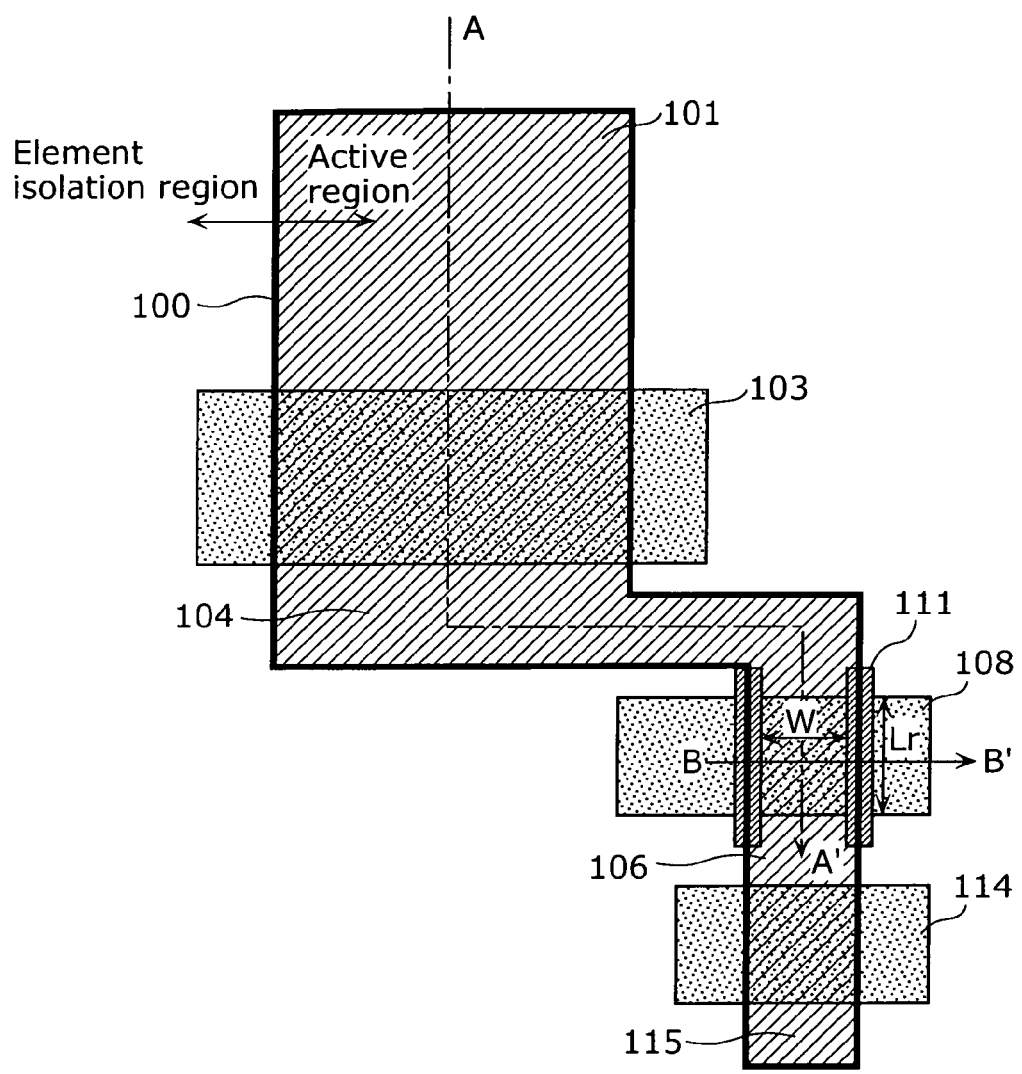
FIG. 5 is a structure diagram (top view) of a solid-state imaging device in a first embodiment of the present invention.

FIG. 5 shows a top view of a solid-state imaging device in the first embodiment of the present invention. This solid-state imaging device is different from the conventional one in that ions 111 (P-type or N-type ions) having electric charge of an opposite polarity to the carriers (electrons or holes) in the channel below the reset gate electrode 108 are distributed around the boundary between the channel below the reset gate electrode 108 and the element isolation region 110 in FIG. 5. The solid-state imaging device in the present embodiment has the same structure as the conventional one shown in FIGS. 2 and 3, except for the above-mentioned distribution of ions.

Figure 6A:
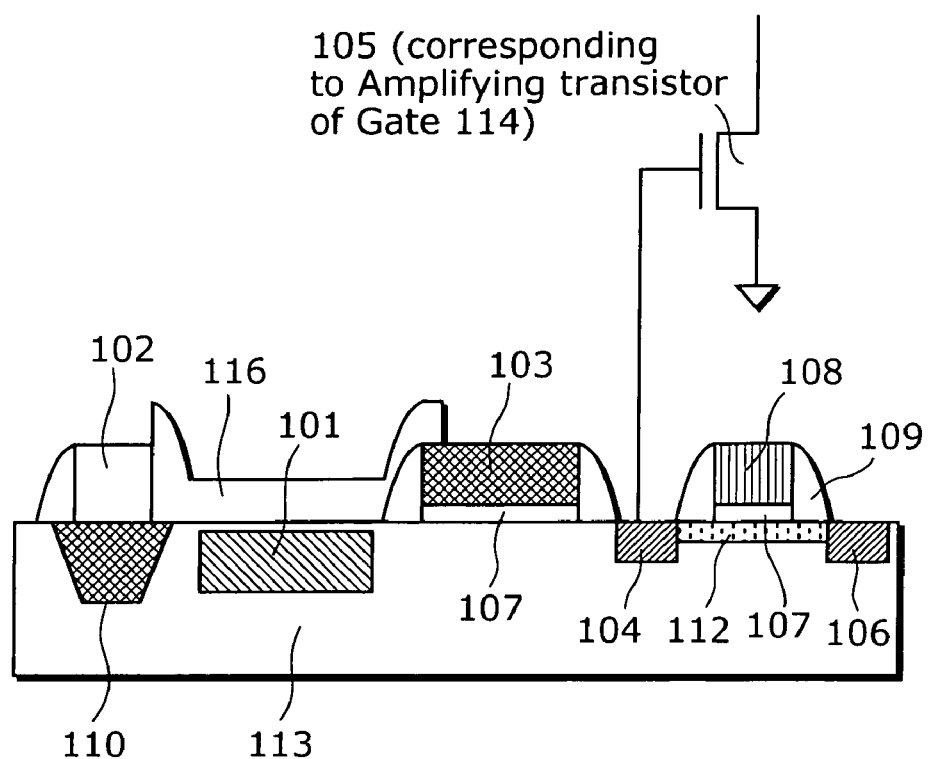
FIGS. 6A and 6B are structure diagrams (cross-sectional views) of the solid-state imaging device in the first embodiment of the present invention.
Figure 6B:
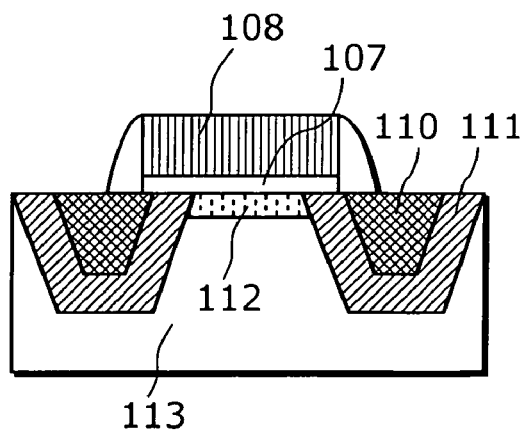

FIGS. 6A and 6B show cross-sectional views of the solid-state imaging device of the first embodiment. A cross section A-A', shown in FIG. 6A, of the solid-state imaging device in FIG. 5 is same as that of the conventional embodiment. However, another cross section B-B' shown in FIG. 6B is different from the conventional embodiment in that ions 111 (P-type or N-type ions) having electric charge of an opposite polarity to the carriers (electrons or holes) of the channel are distributed along the sidewall of the element isolation region 110.

Generally, the channel width of a transistor is determined by the width of an active region in between element isolation regions. FIG. 5 shows a boundary line 100 between an active region and a element isolation region. A region surrounded by the boundary line 100 is an active region. It is possible to reduce the capacitance value Cfd of the detection capacitor 104 as the channel width W below the reset gate electrode 108 decreases. FIGS. 7A and 7B show a reset transistor. This reset transistor is made up of the drain 106, the reset gate electrode 108 and the detection capacitor 104, as mentioned above. FIG. 7A is a diagram showing a cross section B-B' of the solid-state imaging device shown in FIG. 2 in the conventional embodiment, while FIG. 7B is a diagram showing a cross section B-B' of the solid-state imaging device shown in FIG. 5 in the present embodiment. In the case where ions are not distributed in the vicinity of the sidewall of the element isolation region 110 as shown in FIG. 7A, the channel width W is determined by the width of active region 112. On the other hand, in the case where ions (of the opposite polarity to the channel) are distributed in the vicinity of the sidewall of the element isolation region 110 as shown in FIG. 7B, the channel width W decreases. That is because the potential of a conduction band increases and thus electron density decreases in the area into which the ions 111 are implanted.

The advantages of this structure in the present embodiment are described below. The width of the active region 112 is almost determined by the resolution of a stepper used for a lithography process, and it is difficult to reduce the width up to around 0.2 μm to 0.3 μm.

If the resolution of a stepper improves as its performance improves from now on, it will be possible to manufacture a solid-state imaging device having the width of the active region 112 of 0.2 μm or less. However, such case could lead a problem that the substrate surface is damaged and thus fluctuations in the channel width could easily be generated, which makes it extremely difficult to control the channel width W effectively.

On the other hand, in the present embodiment, the ions 111 for enhancing the generation of carriers of an opposite polarity to the channel are distributed around the boundary between the active region 112 and the element isolation region 110. Therefore, it becomes possible to narrow the effective channel width W while reducing the damage on the substrate surface.

The channel width of a transistor is effectively determined by a channel width below a gate electrode. However, it is preferable that the above-mentioned ions are distributed not only in the transboundary region covering both the gate electrode 108 and the active region but also in the manner as shown in FIG. 5. In other words, it is preferable that the ions are distributed not only below the reset gate electrode 108 but also in the region from below the reset gate electrode 108 over the detection capacitor 104 or the drain region 106 seamlessly. This is because not only reduction of the channel length below the gate but also reduction of the channel width of a drain and a source region produces a greater effect of decrease in capacitance.

N-type ions such as arsenic (As) are commonly implanted to form a channel of a reset transistor. Therefore, P-type ions 111 need to be distributed around the boundary between the active region 112 and the element isolation region 110, and boron is usually used for the ions. It is desirable that these ions 111 are distributed in the width of about 0.05 to 0.2 μm in between the boundary line. This is because distribution of too many P-type ions causes an extreme decrease in the channel width and thus makes it difficult to transfer the carriers in the detection capacitor 104 to the drain region 106 even if the reset gate electrode 108 is turned on. If the ions are distributed in the width of about 0.05 to 0.2 μm, it becomes possible to realize a decrease in channel width and removal of carriers from the detection capacitor 104 at the same time. In this case, it is desirable that the gate width is in a range between 0.01 μm and 0.4 μm inclusive, assuming that the width of the active region formed by a stepper is about 0.1 μm to 0.4 μm. Since the transistor capacitance decreases in such region, and therefore removal of carriers from the detection capacitor 104 can be achieved as well.

It is possible to apply, to a manufacturing method for such transistor, a trench isolation structure normally used in a manufacturing method for a field-effect transistor. As shown in FIG. 8A, a trench 117 is formed in a region where an element isolation region is formed on the silicon substrate 113, as shown in FIG. 8B, the ions 111, having electric charge of an opposite polarity to the carriers of the channel, are implanted into the trench 117, and then, as shown in FIG. 8C, an oxide layer 110 is deposited thereon, the substrate surface is planarized and elements such as a gate electrode are formed thereon. This method makes it possible to easily implant the ions 111 along the sidewall of the element isolation region (namely, into the boundary between the active region 112 and the element isolation region 110), while minimizing the number of additional process steps.

This manufacturing method makes it possible to realize the above-mentioned structure by adding only one process step of ion implantation to the normal trench isolation forming process. In this case, it is possible to recover, by heat treatment, the damage on the active region (channel) 112 in the vicinity of the ions 111 caused by ion implantation. It is desirable that the temperature of the heat treatment is 700 to 900 degrees centigrade and the duration of the treatment is 10 to 120 minutes.

As described above, it becomes possible to reduce the capacitance of a reset gate by narrowing the effective channel width, and thus realize microfabrication which goes beyond the limits of a lithography process.

The present embodiment makes it possible to reduce the effective channel width up to about 0.1 µm. In other words, it is possible to reduce not only the channel width in the present embodiment to about one half to one third the conventional width, but also to reduce the capacitance between the detection capacitor 104 and the reset gate to about one half to one third.

A decrease in the capacitance of the detection capacitor 104 results in an increase in the amount of change in the output voltage generated when the electric charge transferred from the photodiode to the detection capacitor 104 is converted into voltage. This increase in the amount of change improves the detection sensitivity as well as the signal-to-noise (S/N) ratio, and therefore brings about improvement in image quality in a MOS-type solid-state imaging device.

It is preferable here that the gate length is as long as possible, and in particular, it is desirable that the gate width is shorter than the gate length. The first reason for this is that a longer gate length makes it possible to average variations in the channel width, and thus reduce variations in the characteristics of a reset transistor formed in each of cells arranged in an array. The second reason is that a longer gate length makes it possible to increase the maximum voltage to be applied between the drain and the source of the reset transistor, and thus remove the electric charge in the detection capacitor 104 when the reset gate is turned on.

It is preferable that the gate length is in a range between 0.1 µm and 1.0 µm inclusive. The gate length of less than 0.1 µm is too short to obtain the favorable transistor characteristics due to a hot channel factor and the like. The gate length of more than 1.0 µm makes the capacitance between the detection capacitor 104 and the reset gate too large to ignore with respect to the capacitance of the detection capacitor 104. The gate length in the above preferable range makes it possible to apply a voltage up to 1V to 5V to the detection capacitor 104.

Second Embodiment

Figure 9:
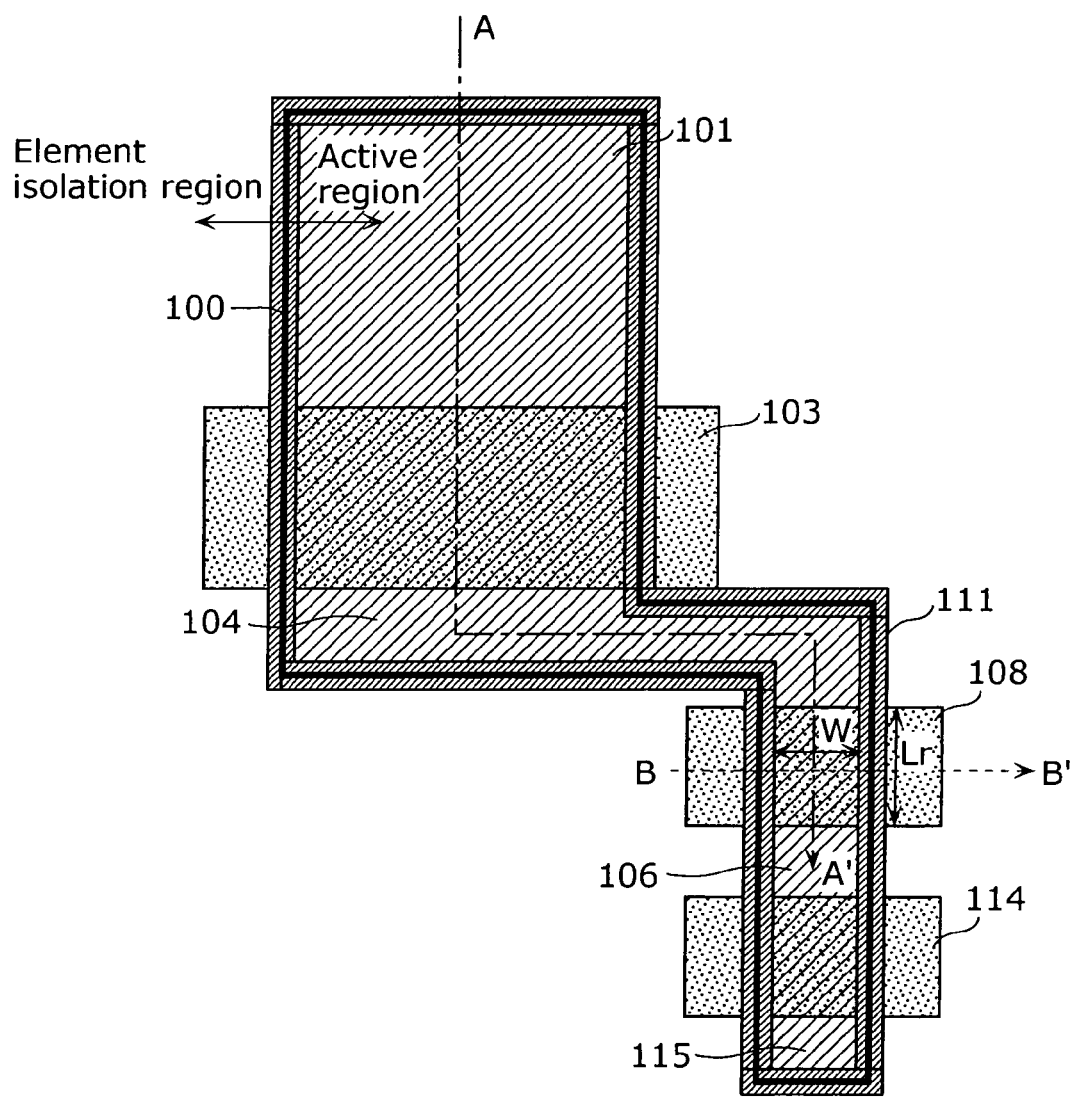
FIG. 9 is a structure diagram (top view) of the solid-state imaging device in the second embodiment of the present invention.
Figure 10A:
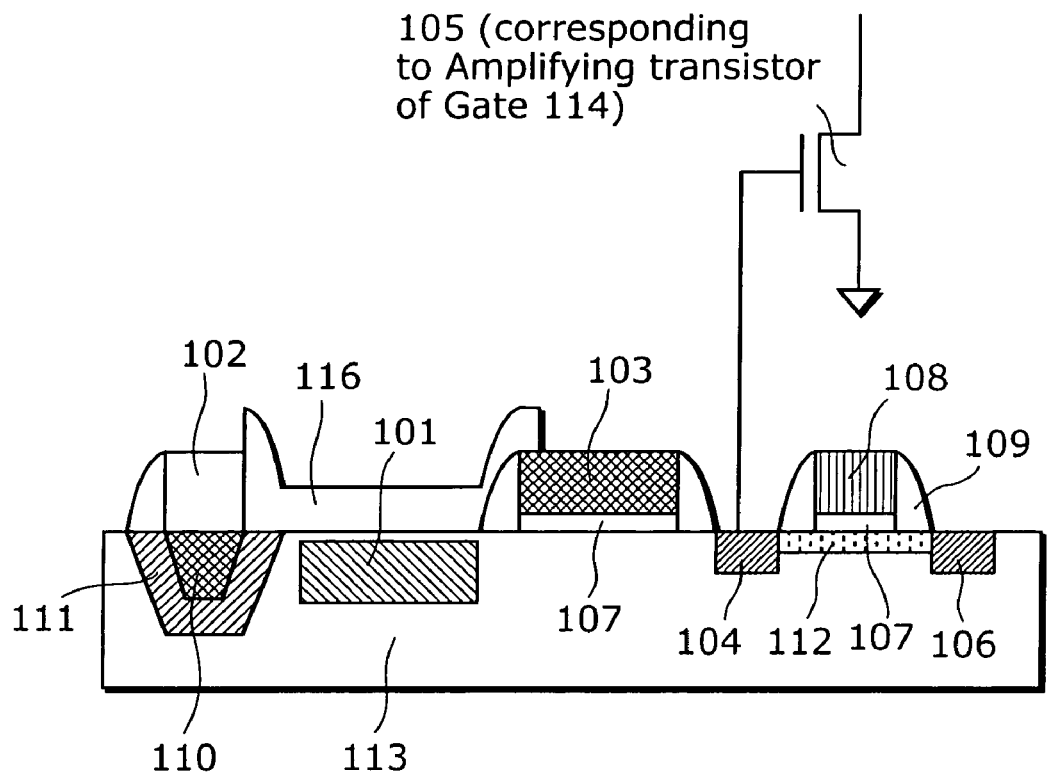
FIGS. 10A and 10B are structure diagrams (cross-sectional views) of the solid-state imaging device in the second embodiment of the present invention.
Figure 10B:
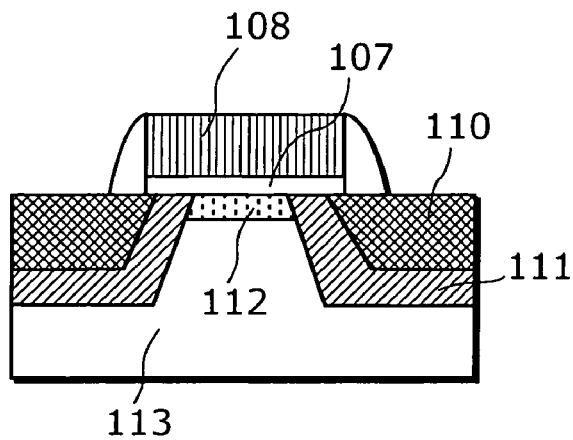

FIG. 9 and FIGS. 10A and 10B show a top view and cross-sectional views of a solid-state imaging device in a second embodiment of the present invention. In order to reduce leakage current from the photodiode 101, it is preferable to implant and distribute, at least in the vicinity of the boundary between the active region and the element isolation region of the photodiode 101, ions (normally P-type) which have electric charge of an opposite polarity to the ions (normally N-type) which have electric charge for forming the photodiode 101. It is also possible, as shown in FIG. 9, to implant ions (normally P-type), which have electric charge of an opposite polarity to the ions (normally N-type) which have electric charge for forming the photodiode 101 and the channel, seamlessly (so that the ions surrounds the entire active region in a unit cell). In FIG. 9, the boundary line 100 between the active region and the element isolation region is shown. The active region is inside the region surrounded by the boundary line 100, and the element isolation region is outside it.

The structure of the second embodiment is same as that of the first embodiment as shown in FIGS. 5 and 6, except that the second embodiment distributes, in the vicinity of the boundary line 100 between the active region and the element isolation region, ions (normally P-type) having electric charge of an opposite polarity to the ions (normally N-type) having electric charge for forming the photodiode 101.

In the case where there exists a leakage current in the photodiode, electric charge is generated without incident light and an output signal is generated as if light enters the photodiode, which causes a noise (white noise). Normally, the channels of the reset transistor and the photodiode are N-type, while P-type ions are distributed in the vicinity of the boundary between the active region and the element isolation region of the photodiode. In other words, it is preferable that the ions 111 of the same type, namely P-type, are distributed in the vicinity of the boundary between the active region and the element isolation region of the photodiode, as shown in FIG. 9.

This is because such only one implantation of ions of the same type makes it possible to distribute the ions 111 as shown in FIGS. 9 and 10 without increasing the number of process steps in the manufacturing process.

Third Embodiment

Figure 11:
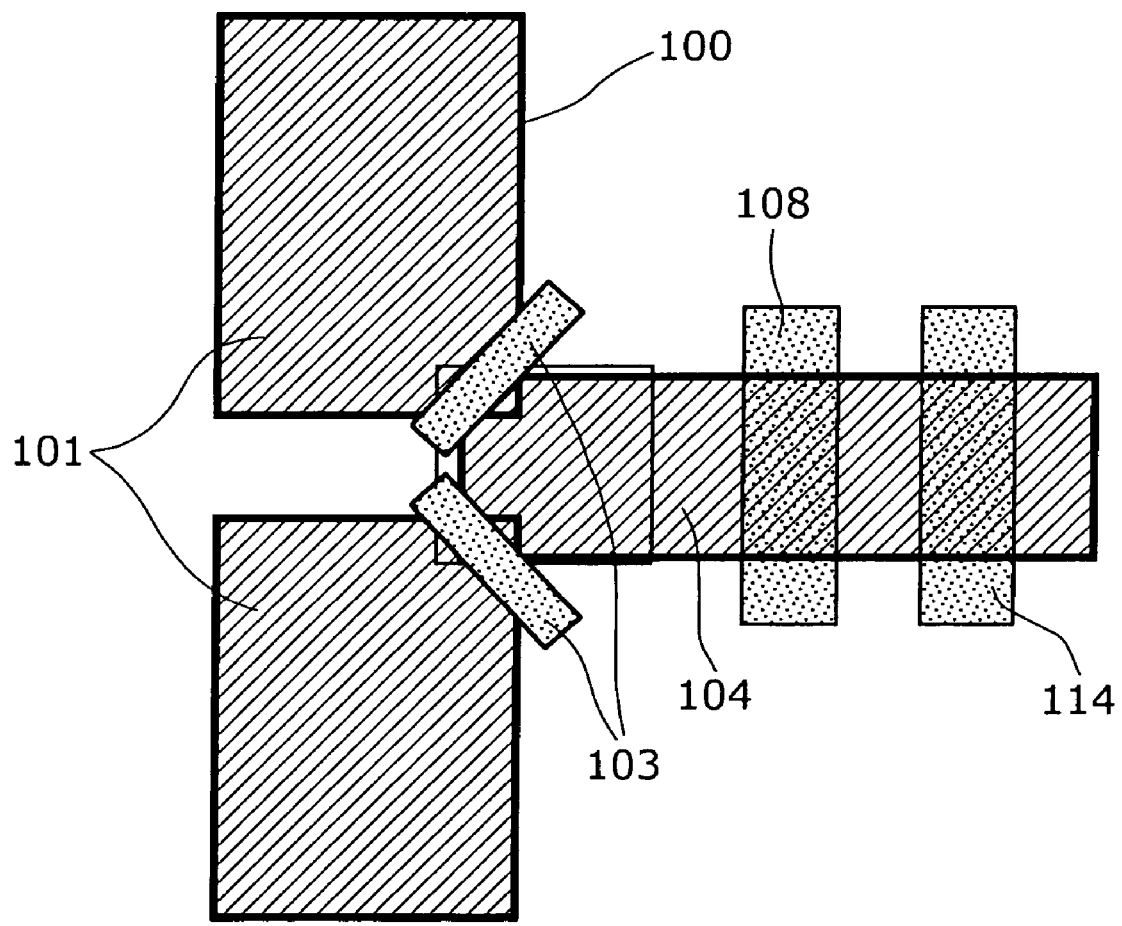
FIG. 11 is a structure diagram (top view) of a solid-state imaging device in a third embodiment of the present invention.

FIG. 11 shows a top view of a solid-state imaging device in the third embodiment of the present invention.

The second embodiment describes the case where the photodiode 101 and the detection capacitor 104 are mounted in a one-to-one relationship. In contrast, in the third embodiment, the photodiodes 101 are mounted in a many-to-one relationship with each of the detection capacitor 104, the reset transistor and the amplifying transistor. The ratio between them is normally two-to-one or four-to-one. The case of two-to-one is called two-pixel-to-one-cell, while the case of four-to-one is called four-pixel-to-one-cell. Since the space for transistors in the many-to-one structure is smaller than that in the one-to-one structure, the former structure has an advantage over the latter that the space to be used for the photodiode 101 becomes larger.

As is the case with the first and second embodiments, in the third embodiment, ions enhancing the generation of carriers of an opposite polarity to the majority carriers in the photodiode 101 are distributed in the vicinity of the boundary 100 between the photodiode 101 and the element isolation region as well as in the vicinity of the boundary 100 between the channels of the transistors and the element isolation region. Such ion distribution makes it possible not only to reduce white noises in the photodiode 101 but also to reduce the capacitance of the detection capacitor 104. It also has an effect that it can be realized without increasing manufacturing process steps.

Fourth Embodiment

Figure 12:
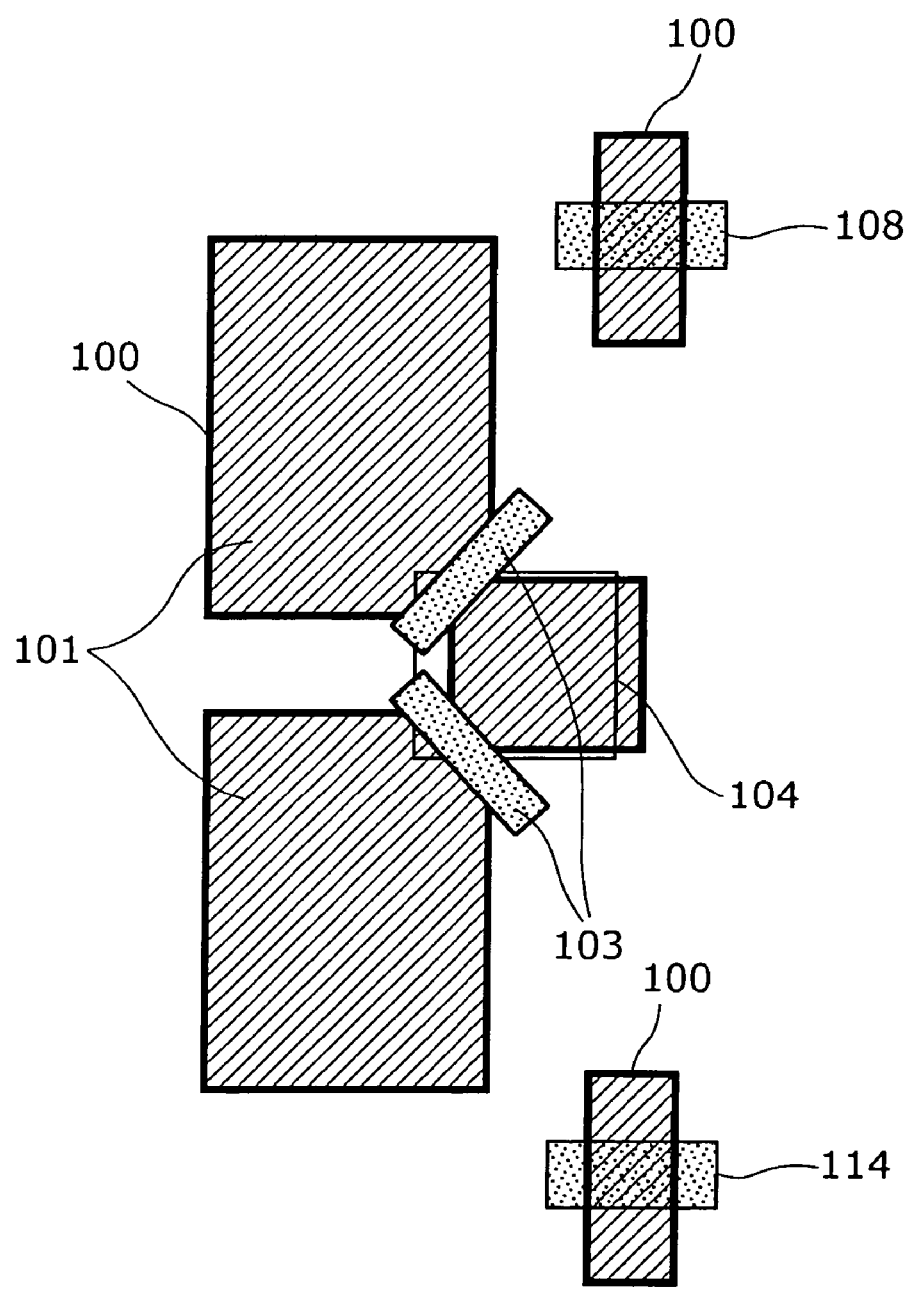
FIG. 12 is a structure diagram (top view) of a solid-state imaging device in a fourth embodiment of the present invention.

FIG. 12 shows a top view of a solid-state imaging device in the fourth embodiment of the present invention.

The fourth embodiment is different from the third embodiment in that the detection capacitor 104, the reset transistor and the amplifying transistor do not share the drain and the source, but have their own drains and sources separately. Therefore, the photodiode 101 and the transistors can be arranged more flexibly.

Again in this case, ions enhancing the generation of carriers of an opposite polarity to the majority carriers in the photodiode 101 are distributed in the vicinity of the boundary 100 between the photodiode 101 and the element isolation region as well as in the vicinity of the boundary 100 between the channels of the transistors and the element isolation region. Such ion distribution makes it possible not only to reduce white noises in the photodiode 101 but also to reduce the capacitance of the detection capacitor 104.

Although some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable, in particular, to a microfabricated MOS-type solid-state imaging device and a camera equipped with such solid-state imaging device. To be more specific, the present invention is applicable to an image sensor, a digital still camera, a camera-equipped cell phone, a camera mounted in a laptop, a camera unit to be connected to an information processing device and the like with high sensitivity and high image quality.

What is claimed is:

1. A solid-state imaging device, comprising:
    a semiconductor substrate;
    a photodiode, formed on the semiconductor substrate, that performs photoelectric conversion of incident light into signal charge;
    a transfer transistor, formed on the semiconductor substrate, that transfers the signal charge accumulated in the photodiode;
    a detection capacitor, formed on the semiconductor substrate, that accumulates the signal charge transferred by the transfer transistor;
    a reset transistor, formed on the semiconductor substrate, that discharges, into a drain, the signal charge accumulated in the detection capacitor; and
    a trench isolation region, formed on the semiconductor substrate, that surrounds an active region of the photodiode, the transfer transistor, the detection capacitor and the reset transistor,
    wherein ions are distributed in at least a first boundary between an active region directly below a gate electrode of the reset transistor and the trench isolation region, the ions enhancing generation of carriers of an opposite polarity to a polarity of carriers in a channel below the gate electrode of the reset transistor,
    wherein the ions are distributed in at least the first boundary in a band having a width in a range of 0.05 µm and 0.20 µm, and
    wherein the reset transistor has an effective gate width shorter than an effective gate length.

2. The solid-state imaging device according to claim 1, wherein the ions enhancing the generation of the carriers of the opposite polarity to the polarity of the carriers in the channel below the gate electrode of the reset transistor are distributed seamlessly below the gate electrode of the reset transistor and adjacent to one of the detection capacitor and the drain.

3. The solid-state imaging device according to claim 1, wherein an effective gate width of the reset transistor is between 0.01 µm to 0.4 µm, inclusive.

4. The solid-state imaging device according to claim 1, wherein an effective gate length of the reset transistor is between 0.1 µm to 1.0 µm, inclusive.

5. The solid-state imaging device according to claim 1, wherein the ions are distributed in a second boundary between an active region forming the photodiode and the trench isolation region, the ions enhancing generation of carriers of an opposite polarity to majority carriers of the photodiode.

6. The solid-state imaging device according to claim 5, wherein the ions enhancing the generation of the carriers of the opposite polarity to the majority carriers are distributed in the second boundary, seamlessly with the ions distributed in the first boundary between the active region and the trench isolation region.

7. The solid-state imaging device according to claim 1, wherein a plurality of photodiodes share one detection capacitor and one reset transistor,
    wherein active regions of each photodiode of the plurality of photodiodes, the detection capacitor and the reset transistor are connected seamlessly, and
    wherein the ions that enhance the generation of the carriers of the opposite polarity to the polarity of the carriers in the channel below the gate electrode of the reset transistor are distributed on sidewalls of the trench isolation region surrounding the active regions.

8. The solid-state imaging device according to claim 1, wherein a plurality of photodiodes share one detection capacitor and one reset transistor,
    wherein active regions of each photodiode of the plurality of photodiodes and the detection capacitor are connected seamlessly, while active regions of the plurality of photodiodes and an active region of the reset transistor are not directly connected, and
    wherein the ions enhancing the generation of the carriers of the opposite polarity to the polarity of the carriers in a channel below the gate electrode of the reset transistor are distributed on each sidewall of the trench isolation region surrounding the active regions.

9. The solid-state imaging device according to claim 1, wherein the effective gate width of the reset transistor is between 0.01 µm to 0.40 µm, inclusive, and an effective gate length of the reset transistor is between 0.10 µm to 1.00 µm, inclusive.

10. The solid-state imaging device according to claim 9, wherein a plurality of photodiodes share one detection capacitor and one reset transistor,
    wherein active regions of each photodiode of the plurality of photodiodes, the detection capacitor, and the reset transistor are connected seamlessly, and
    wherein the ions that enhance the generation of the carriers of the opposite polarity to the polarity of the carriers in the channel below the gate electrode of the reset transistor are distributed on sidewalls of the trench isolation surrounding the active regions.

11. The solid-state imaging device of claim 9, wherein a plurality of photodiodes share one detection capacitor and one reset transistor,
    wherein active regions of each photodiode of the plurality of photodiodes and the detection capacitor are connected seamlessly, while active regions of the plurality of photodiodes and an active regions of the reset transistor are not directly connected, and
    wherein the ions enhancing the generation of the carriers of the opposite polarity to the polarity of the carriers in a channel below the gate electrode of the reset transistor are distributed on each sidewall of the trench isolation surrounding the active regions.

* * * * *